(12) United States Patent
Bode

(10) Patent No.: US 11,121,665 B1
(45) Date of Patent: Sep. 14, 2021

(54) CURRENT MEASUREMENT APPARATUS

(71) Applicant: NXP USA, Inc., Austin, TX (US)

(72) Inventor: Hubert Martin Bode, Haar (DE)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/842,691

(22) Filed: Apr. 7, 2020

(51) Int. Cl.
*H02P 29/024* (2016.01)
*G01R 31/34* (2020.01)

(52) U.S. Cl.
CPC ........ *H02P 29/0241* (2016.02); *G01R 31/343* (2013.01)

(58) Field of Classification Search
None
See application file for complete search history.

(56) References Cited

U.S. PATENT DOCUMENTS

| | | | |
|---|---|---|---|
| 2004/0070354 A1 | 4/2004 | Krueger | |
| 2007/0035271 A1* | 2/2007 | Quirion | H02P 29/032 318/801 |
| 2007/0040523 A1* | 2/2007 | Quirion | H02P 6/28 318/434 |
| 2018/0375457 A1* | 12/2018 | Kitamura | H02M 7/48 |
| 2019/0341769 A1* | 11/2019 | Askan | H02H 1/0007 |

OTHER PUBLICATIONS

"Current Sensing With <1-μs Settling for 1-, 2-, and 3-Shunt FOC Inverter Reference Design," TIDUCY7, Mar. 2017, Texas Instruments, Incorporated, 47 pages.
E. Viramontes, "Motor Control with Freescale Microcontrollers," Freescale Semiconductor, Inc., Oct. 2010, 157 pages.
AN2019-17 EVAL-IMM101T User Manual, Infineon Technologies AG, Jun. 18, 2019, 38 pages.
MLX81206/08 TruSense BLDC Motor Controller Product Abstract, Melexis NV, copyright 2016, 32 pages.
S12 MagniV Mixed-Signal MCUs—S12ZVM Family, NXP B.V., 2016, 1 page.

* cited by examiner

*Primary Examiner* — Bentsu Ro

(57) ABSTRACT

Integrated circuitry, such as a microcontroller, for controlling an electric motor includes circuitry for measuring a bi-directional current flowing within a coil of the electric motor. The current is sensed by an externally implemented current sensing element, such as a shunt resistor, to produce a differential voltage that is delivered to input pins of the microcontroller, which are protected by electrostatic discharge protection circuits. Current sources implemented within the microcontroller are coupled to the input pins, and work in concert with external resistors to shift the differential voltage so that it is maintained within an appropriate voltage operating range so that an accurate measurement of the bi-directional current can be made by the microcontroller.

20 Claims, 2 Drawing Sheets

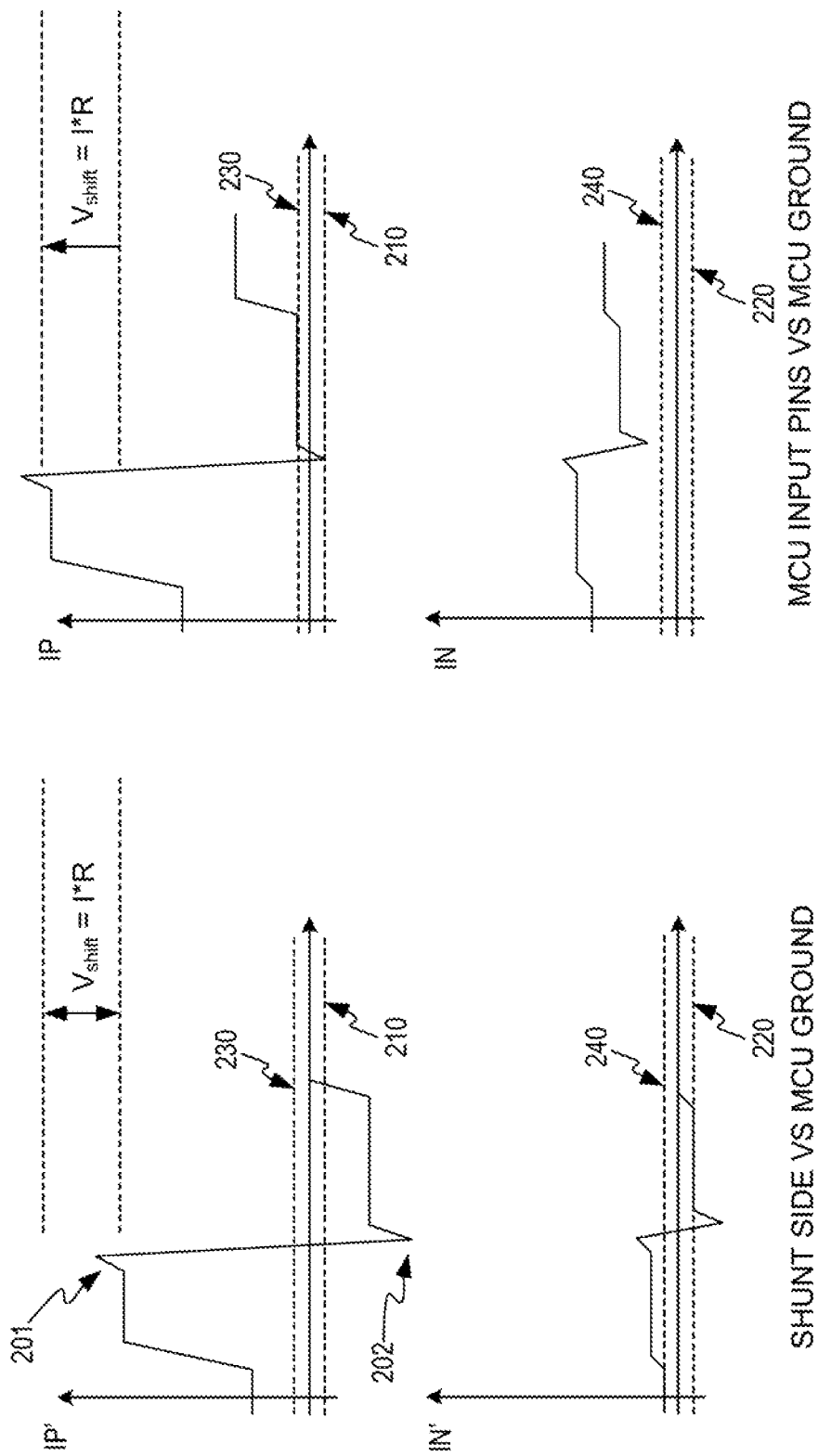

CURRENT MEASUREMENT APPARATUS

TECHNICAL FIELD

The present disclosure relates in general to an apparatus for measuring current and, in particular, to measuring bi-directional current by integrated circuitry utilizing an external current sensing element.

BACKGROUND

In previous generations of motor vehicles, various accessories within the vehicle (e.g., water pumps, fuel pumps, oil pumps, etc.) were powered via a belt coupled to the crankshaft of the engine. In recent generations of motor vehicles, power from the crankshaft has been replaced by powering these accessories with electric motors. Additionally, modern vehicles utilize electric motors for performing other tasks within the vehicle (e.g., electric windows, windshield wipers, etc.).

Such electric motors may be implemented as brushless DC electric motors, which can be controlled by microcontrollers. Such brushless DC electric motors are powered by direct current ("DC") electricity via an inverter or switching power supply, which produces electricity in the form of alternating current ("AC") to drive each phase of the motor via a closed loop controller. The controller provides pulses of current to the motor windings or coils that control the speed and torque of the motor. Such brushless motor commutation can be implemented in software algorithms using a microcontroller or microprocessor computer.

Current flow within these coils of the electric motor is one of the most common parameters used for evaluating, controlling, and diagnosing the operational effectiveness of the electronic systems that control the electric motor and the electric motor itself. A common sensing element used to detect current flow is a low-value resistor placed in the current path. This resistor, generally called a shunt resistor or simply a shunt, develops a voltage across it that is proportional to the current passing through it. The voltage developed across the shunt resistor is quite small, and thus often requires conditioning and/or amplification before being converted by an analog-to-digital converter ("ADC"). An analog front end, such as a programmable gain amplifier ("PGA") may be implemented to convert the small differential voltage developed across the shunt resistor to a larger output voltage that uses more of the full measurement range of the ADC. The microcontroller then uses the digitized measurement of current flow to assist in controlling the electric motor, optimize its performance, or to implement safety protocols.

During the switching of the currents to the various coils in brushless DC electric motors, when a current to a particular coil is switched off, parasitic inductances operate to maintain the current. Furthermore, in various applications of electric motors within motor vehicles, the current within the coils may periodically flow in both positive and negative directions, such as when the electric motor is being braked or is windmilling, such as may be caused within the cooling fan motor.

However, since microcontrollers are implemented with electrostatic discharge ("ESD") protection circuits in order to protect circuitry within the microcontroller from voltage spikes, negative voltages sensed by a shunt resistor coupled to an electric motor coil may be clipped by the diodes of the ESD protection circuits, which can result in supplying inaccurate voltage levels to the PGA so that it produces an inaccurate measurement of the current.

BRIEF DESCRIPTION OF THE DRAWINGS

FIG. 2 illustrates plots of exemplary differential voltages produced by a current sensing element sensing bi-directional currents within a coil of an electric motor.

FIG. 3 illustrates plots of the exemplary differential voltages of FIG. 2 that have been shifted in accordance with embodiments of the present disclosure.

DETAILED DESCRIPTION

Figure 1:
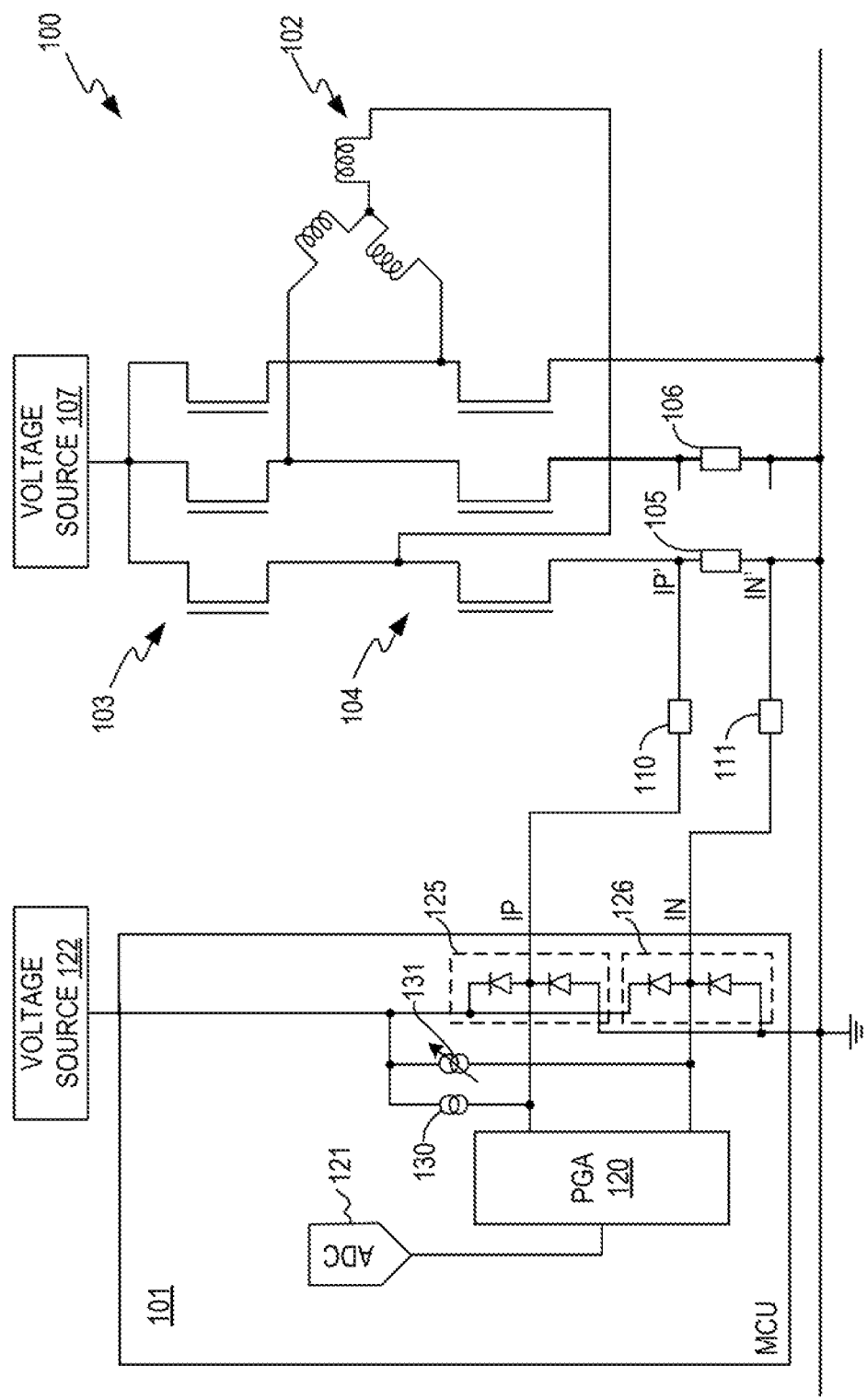
FIG. 1 illustrates a block diagram of circuitry and circuit elements configured in accordance with embodiments of the present disclosure for measuring a current within a coil of an electric motor.

Embodiments of the present disclosure provide integrated circuitry (e.g., a microcontroller) configured for controlling an electric motor to include circuitry for measuring a bi-directional current flowing within a coil of the electric motor. Embodiments of the present disclosure are also applicable for controlling an inductive load in which a bi-directional current is produced. The current is sensed by an externally implemented shunt resistor to produce a differential voltage that is delivered to input pins of the microcontroller, which are protected by electrostatic discharge protection circuits. Current sources implemented within the microcontroller are coupled to the input pins, and work in concert with external resistors to shift the differential voltage so that it is maintained within an appropriate voltage operating range so that an accurate measurement of the bi-directional current can be made by the microcontroller. Embodiments of the present disclosure are applicable to any integrated circuitry implemented for motor control applications, including, but not limited to, electric motors installed in vehicles (e.g., a water pump, oil pump, fuel pump, turbocharger, supercharger, tailgate closing, seatbelt system, power windows, parking brake, ABS pump, headlight cleaning or maneuvering, engine cooling fan, A/C compressor, starter/alternator, windshield wipers, steering wheel adjustment, mirror adjustment, seat/headrest controls, door closing, convertible or sliding roof), and for any other control of inductive loads, such as used in DC/DC converters and the like.

FIG. 1 illustrates a system or apparatus 100 in which integrated circuitry (e.g., an integrated circuit implemented as a microcontroller unit ("MCU"), microprocessor, microcomputer, and/or a system-on-chip ("SoC")) 101 is configured to control the operation of an electronically commutated electric motor 102 (e.g., a brushless DC electric motor (two-phase or three-phase), PSM motor (permanent magnet synchronous motor), bi-directional DC motor, uni-directional DC motor, electromagnetic actuator, etc.). For purposes of the following description, the integrated circuitry 101 will be referred to as the MCU 101. Though embodiments of the present disclosure are hereinafter described with respect to measuring a current flowing within an electric motor, embodiments are also applicable to measuring a current within an inductive load controlled by the MCU 101.

The electric motor 102 is supplied with power from a voltage source 107 (e.g., a vehicle battery). The voltage source 107 provides suitable voltages to the coils of the electric motor 102 via suitable switching elements, e.g., a set of high-side power field effect transistors ("FETs") 103 in combination with a set of low-side power FETs 104. Commutation of the coils of the electric motor 102 is controlled by a set of one or more algorithms programmed within the MCU 101. The set of one or more algorithms are configured for operation of circuitry and circuit elements (e.g., charge pump, bootstrap circuit and filtering, reverse battery protection, etc.) coupled to the high-side power FETs 103 and the low-side power FETs 104. This various circuitry, circuit elements, and their connections between the MCU 101 and the power FETS 103, 104 are not shown for the sake of simplicity. Nevertheless, such circuitry, circuit elements, and their connections are well-known in the art.

The current provided by the power FETs to the coils of the electric motor 102 may be sensed by one or more current sensing elements 105, 106, which may be implemented with shunt resistors. Though embodiments are described herein utilizing shunt resistors, the current sensing elements 105, 106 may be implemented with any well-known device suitable for sensing current as described herein. Though two such shunt resistors are illustrated in FIG. 1, embodiments of the present disclosure are applicable to the utilization of any number of one or more shunt resistors for sensing current in one or more of the coils of the electric motor 102. Connections from the shunt resistor 106 to the MCU 101 are not illustrated for the sake of simplicity. However, in accordance with certain embodiments of the present disclosure, the circuitry and circuit elements described hereinafter may be duplicated for measuring current through the shunt resistor 106 in a similar manner.

Since embodiments of the present disclosure are pertinent to the measurement of current within a coil of an electric motor or other inductive loads, only the elements pertaining to such a current measurement capability are illustrated within the MCU 101. A person of ordinary skill in the art would appreciate that the MCU 101 includes other circuitry and circuit elements for monitoring and controlling the operation of the electric motor 102.

The MCU 101 may include a programmable gain amplifier ("PGA") 124 receiving an analog differential voltage through the input pins IP and IN for measuring the current provided to one of the coils of the electric motor 102 as sensed by the shunt resistor 105. However, any suitable circuitry configured to produce a current measurement as a function of a differential voltage signal may be utilized as an alternative to the PGA 120, including, but not limited to, a switched capacitor amplifier or a linear differential amplifier with input buffers. The analog differential voltage measured by the PGA 120 is converted to a digital value by the analog-to-digital converter ("ADC") 121 for use by other circuitry within the MCU 101 for assisting with the monitoring and control of the electric motor 102.

As is commonly implemented within integrated circuits, the input pins IP and IN may be protected by electrostatic discharge ("ESD") protection circuits 125 and 126, respectively. The ESD protection circuits 125 and 126 are illustrated as voltage clamping circuits with dual diodes in a manner well-known in the art. Each of the ESD protection circuits 125, 126 are coupled between a voltage source 122, suitable for supplying power to the MCU 101 (e.g., 5 V), and a ground potential. The ESD protection circuit 125 is coupled to the input pin IP, and the ESD protection circuit 126 is coupled to the input pin IN. As is well known in the art, the clamping diodes within each of the ESD protection circuits 125, 126 are configured to clamp the input voltage received at their respective input pins to a range of voltages between the voltage level of the voltage source 122 and the ground potential, minus the forward voltages of the clamping diodes.

As previously noted herein, for monitoring and control of the electric motor 102 by the MCU 101, the MCU 101 utilizes the measurement of current within one or more of the coils of the electric motor 102. This is accomplished by measuring a voltage drop across the terminals (i.e., a differential voltage) of a shunt resistor (e.g., one or more of the shunt resistors 105, 106). With respect to the shunt resistor 105, one of the terminals is coupled to a terminal of a power FET supplying current to one of the coils of the electric motor 102, while the other terminal of the shunt resistor 105 is coupled to a ground potential. It is this differential voltage that is to be utilized by the PGA to measure the current within the coil of the electric motor or other inductive load.

A problem associated with measuring current in this manner is that it is unable to accurately account for negative voltages (e.g., caused by parasitic inductances during switching of the power FETs, general negative current flow, or due to ground shift effects) and/or in order to measure a bidirectional current (i.e., during commutation, a current flowing within a coil of the electric motor may become negative). Consequently, the voltages sensed by the shunt resistor 105 can have significantly negative values. A result is that one or more of the voltages supplied to the PGA is outside of its normal operating range and/or the ESD protection circuits 125, 126 may clip a received negative voltage due to one of the clamping diodes being coupled to the ground potential (clipping of a voltage or voltage signal results in a truncation of the entire magnitude of the voltage or voltage signal). In such an instance, the differential voltage received by the PGA 120 may not accurately reflect the actual voltage difference, resulting in an inaccurate measurement of the current flowing within that coil during that instant.

Embodiments of the present disclosure are implemented for addressing this problem by adjusting the voltages received at the input pins IP and IN by an amount sufficient to shift magnitudes of the differential voltage to within the normal operating voltage range of the PGA and/or within the normal operating voltage ranges of the ESD protection circuits 125, 126 so that the voltages are not clipped, and thus the PGA 120 receives an accurate differential voltage so that it can accurately determine the measured current flowing within the coil of the electric motor 102.

In order to accomplish the foregoing, embodiments of the present disclosure implement one or more current sources that are suitable for shifting the differential voltage in a manner as described herein. In the exemplary embodiment illustrated in FIG. 1, a current source 130 is coupled between the voltage source 122 and the input pin IP, and a current source 131 is coupled between the voltage source 122 and the input pin IN. A resistor 110 is coupled between the input pin IP and the terminal IP' of the shunt resistor 105 that is coupled between the shunt resistor 105 and the power FET supplying current to the coil of the electric motor 102 for which current is to be measured. A resistor 111 is coupled between the input pin IN and the terminal IN' of the shunt resistor 105 that is coupled to a ground potential. In accordance with embodiments of the present disclosure, the resistive values of the resistors 110 and 111 may be selected to be substantially equal, and of a magnitude significantly greater than the resistive value of the shunt resistor 105.

In accordance with embodiments of the present disclosure, the currents provided by the current sources 130, 131 may be predetermined to be substantially equal. However, as well be further described herein, one or more of the current sources 130, 131 may be implemented as a variable, or trimmable, current source. Alternatively, the currents provided by the current sources 130, 131 may be predetermined to be different from each other, and correspondingly, the resistive values of the resistors 110 and 111 may be selected to be different from each other in order to match the differences in the currents from the current sources 130, 131.

The combination of the current source 130 and the resistor 110 results in a shifting of the voltage $V_1$ at the terminal IP' by a value determined by a multiplication of the current $I_1$ provided by the current source 130 and the resistive value $R_1$ of the resistor 110 (i.e., $V_{1shift} = I_1 * R_1$). The combination of the current source 131 and the resistor 111 results in a shifting of the voltage at the terminal IN' by a value determined by multiplication of the current $I_2$ provided by the current source 131 and the resistive value $R_2$ of the resistor 111 (i.e., $V_{2shift} = I_2 * R_2$). Note that the resistor values of the resistors 110, 111 and the set points of the current sources 130, 131 may be predetermined in order to provide to the PGA a proper differential voltage range for a satisfactory measurement of the current by the shunt resistor 105.

FIGS. 2 and 3 illustrate examples of how embodiments of the present disclosure as described with respect to FIG. 1 shift the differential voltage provided by the shunt resistor 105 in order that a differential voltage is received by the PGA 120 so that it can accurately determine the current measured within the coil of the electric motor 102. In each of the plots illustrated in FIGS. 2 and 3, the x axis represents time, while the portion of they axis above the x axis represents a positive voltage, and the portion of they axis below the x axis represents a negative voltage. The negative clipping limit of the ESD protections circuit 125 is indicated in the upper plots of FIGS. 2 and 3 by the horizontal dashed lines 210 below the x axes of those plots. The negative clipping limit of the ESD protections circuit 126 is indicated in the lower plots of FIGS. 2 and 3 by the horizontal dashed lines 220 below the x axes of those plots.

FIG. 2 illustrates plots of exemplary voltages produced by the shunt resistor 105 at its respective terminals IP' and IN'. The upper plot in FIG. 2 represents an exemplary voltage signal produced at the terminal of the shunt resistor 105 resulting from a bidirectional current flowing within a coil of the electric motor 102 showing how such a bidirectional current can cause this voltage signal to transition from a positive voltage to a negative voltage. The lower plot in FIG. 2 represents an exemplary voltage signal produced at the terminal IN' of the shunt resistor 105 resulting from the bidirectional current flowing within the coil of the electric motor 102 showing how such a bidirectional current can cause this voltage signal to transition from a positive voltage to a negative voltage.

During a commutation of the coils of the electric motor 102, the current within the coil being sensed by the shunt resistor 105 may become significantly negative, which results in the voltage at the terminal becoming correspondingly negative. Without implementation of embodiments of the present disclosure, such a negative voltage may fall outside of the normal operating range of the PGA (shown in the upper plot of FIG. 2 as falling below the horizontal dashed line 230, and in the lower plot of FIG. 2 as falling below the horizontal dashed line 240; the dashed lines 230, 240 depict a non-limiting example of such an operating range) and/or would be clipped by the ESD protection circuit 125 (though not directly shown by the upper plots in FIGS. 2 and 3, it can be readily seen that the negative voltage produced at the terminal IP' would be clipped by the ESD protection circuit 125 so that the corresponding voltage signal delivered to the PGA 120 does not have a negative value less than as indicated by the horizontal dashed line).

Even though the voltage at the terminal IN' may not be adversely affected by the ESD protection circuit 126 since its value is intended to be substantially near the ground potential, it can be readily seen that the differential voltage to be received by the PGA 120, i.e., the difference in magnitude between the clipped negative voltage from the terminal IP' and the voltage from the terminal IN, will no longer accurately represent the current sensed by the shunt resistor 105, and thus an incorrect measurement of this negative current flowing within the coil of the electric motor 102 is output by the PGA 120 and subsequently delivered to control circuitry within the MCU 101. Since accurate measurements of such negative currents within the coils of the electric motor 102 may be necessary for certain operations of the electric motor 102, such inaccurate current measurements will have an adverse effect upon the ability of the MCU 101 to properly monitor and control the electric motor 102. Additionally, shifting of the voltage at the terminal IN' may be performed in order to sustain an accurate differential voltage if there are ground shift effects due to the particular topology associated with the printed circuit board on which the various elements are mounted.

In order for the PGA 120 to be able to accurately measure a magnitude of the current sensed by the shunt resistor 105, embodiments of the present disclosure shift the differential voltage supplied by the shunt resistor 105 so that it falls within a normal operating range of the PGA 120. To correct for the clipping of the voltage produced by the terminal IP' of the shunt resistor 105, embodiments of the present disclosure shift this voltage so that the range of voltages provided by the terminal IP' of the shunt resistor 105 falls within the operating range of the ESD protection circuit 125. So that the differential voltage received by the PGA 120 accurately reflects the current measured in the coil of the electric motor 102, the voltage supplied by the terminal IN of the shunt resistor 105 is also correspondingly shifted.

This shifting operation is demonstrated in the exemplary plots illustrated in FIG. 3. These plots show how the voltages received at the input pins IP and IN are shifted, which results in the voltages pertaining to both positive and negative currents flowing within the coil of the electric motor 102 falling within the normal operating range of the PGA 120 and/or falling within the normal operating range of the ESD protection circuit 125 so that the negative voltage pertaining to a negative current within the coil of the electric motor 102 is not clipped by the ESD protection circuit 125. The voltage received at the input pin IN is also shifted so that the differential voltage received at the input pins IP and IN is received by the PGA 120 in a manner that accurately represents the various currents flowing within the coil of the electric motor 102. The upper plot in FIG. 3 represents a shifting of the exemplary voltage signal supplied by the terminal of the shunt resistor 105 to the shifted voltage received at the input pin IP. Shifting of the voltage to the voltage IP results from a change in voltage produced across the resistor 110 by current from the current source 130 (i.e., $V_{1shift} = I_1 * R_1$). The lower plot in FIG. 3 represents a shifting of the exemplary voltage signal supplied by the terminal IN' of the shunt resistor 105 to the shifted voltage received at the input pin IN. Shifting of the voltage IN' to the voltage IN results from a change in voltage produced across the resistor 111 by current from the current source 131 (i.e., $V_{2shift} = I_2 * R_2$).

In accordance with certain embodiments of the present disclosure, the set points of the current sources 130, 131 and the resistive values of the resistors 110, 111 are predetermined so that the differential voltage produced by the shunt resistor 105 is shifted by the current sources 130, 131 in concert with the external resistors 110, 111, respectively, so that it falls within a normal operating range of the PGA 120 regardless of whether the differential voltage is beyond the normal operating range of the ESD protection circuits 125, 126 (i.e., regardless of whether the differential voltage produced by the shunt resistor 105 would be clipped by either or both of the ESD protection circuits 125, 126).

Note that the exemplary plots illustrated in FIGS. 2 and 3 show that parasitic spikes (e.g., see the spikes 201 and 202) in these voltages are not necessarily required to be accounted for since control algorithms performed within the MCU 101 typically do not require a current measurement during the occurrence of such parasitic spikes.

In accordance with embodiments of the present disclosure, the resistors 110, 111 may be implemented externally from the MCU 101, such as on a printed circuit board on which the MCU 101 is mounted along with other circuitry (not shown) utilized for controlling operation of the electric motor 102.

As previously noted, one or more of the current sources 130, 131 may be implemented as a variable, or trimmable, current source. In the exemplary embodiment illustrated in FIG. 1, the current source 131 is implemented as a variable, or trimmable, current source. The variable current source 131 may be adjusted so that its output current is adjusted for any differences in resistive values between the resistors 110 and 111

In accordance with certain embodiments of the present disclosure, during startup of the MCU 101, when the coils of the electric motor 102 are not energized (therefore, since there is no flow of current through the coils, the ADC 121 should be outputting a zero current measurement), a trim algorithm implemented within the MCU 101 may adjust the current produced by the variable current source 131 to obtain a zero or minimum offset on the PGA 120 so that it passes a zero current measurement to the ADC 121. For example, the trim algorithm can step through the offered trimming steps for the current source 131, and then read the output from the ADC 121 for each trimming step and select the one that produces an ADC 121 output nearest to a desired reading for a zero current measurement.

Embodiments of the present disclosure provide an apparatus suitable for measuring a current in a coil of an electric motor that includes a shunt resistor with a first terminal adaptable for coupling to a switching element configured to provide power to the coil of the electric motor, and a second terminal adaptable for coupling to a ground potential; a microcontroller configured to control operation of the electric motor, wherein the microcontroller includes a first input pin, a second input pin, a first ESD protection circuit coupled to the first input pin, a second ESD protection circuit coupled to the second input pin, a first current source coupled between a voltage source terminal and the first input pin, and a second current source coupled between the voltage source terminal and the second input pin; a first resistor coupled between the first terminal of the shunt resistor and the first input pin; and a second resistor coupled between the second terminal of the shunt resistor and the second input pin. The first and second current sources may be configured to shift a differential voltage between the first and second input pins by an amount proportional to voltage drops across the first and second resistors caused by currents supplied by the first and second current sources, respectively, wherein the differential voltage is produced by the shunt resistor sensing the current in the coil of the electric motor. The first current source may be configured to shift a voltage signal received by the first pin so that the first ESD protection circuit does not clip the voltage signal when the shunt resistor senses a negative current in the coil, wherein the voltage signal is produced by the shunt resistor sensing the negative current in the coil of the electric motor. The microcontroller may further include current measurement circuitry configured to produce an analog current measurement as a function of the differential voltage, wherein the current measurement circuitry is coupled to the first and second input pins, and an ADC coupled to an output of the current measurement circuitry, wherein the ADC may be configured to convert the analog current measurement to a digital value for use by the microcontroller in controlling the operation of the electric motor. The first current source may be configured to produce a first current, $I_1$, at the first input pin, and wherein the second current source may be configured to produce a second current, $I_2$, at the second input pin, and wherein the first resistor has a first resistance, $R_1$, and wherein the second resistor has a second resistance, $R_2$, wherein the first current source may be configured to shift a first voltage received at the first pin relative to a second voltage sensed at the first terminal of the shunt resistor by an amount equal to and wherein the second current source may be configured to shift a third voltage received at the second pin relative to a fourth voltage sensed at the second terminal of the shunt resistor by an amount equal to $I_2*R_2$. At least one of the first and second current sources may be a variable current source. The variable current source may be adjusted to reduce a difference between $I_1*R_1$ and $I_2*R_2$. The variable current source may be adjusted to obtain a zero or minimum offset between the first and second input pins when a voltage differential between the second and fourth voltages is zero. The electric motor may be a brushless DC electric motor.

Embodiments of the present disclosure provide a microcontroller that includes a first input pin, a second input pin, a PGA configured to measure a current signal represented by a differential voltage received at the first and second input pins, a first current source coupled between a voltage source terminal and the first input pin, and a second current source coupled between the voltage source terminal and the second input pin, wherein the first and second current sources are configured to shift the differential voltage so that it is maintained within a normal operating range of the PGA. The microcontroller may further include a first ESD protection circuit coupled to the first input pin, and a second ESD protection circuit coupled to the second input pin, wherein the first and second current sources are configured to shift the differential voltage so that the first ESD protection circuit does not clip a voltage signal received by the first input pin. The microcontroller may further include a first ESD protection circuit coupled to the first input pin, and a second ESD protection circuit coupled to the second input pin, wherein the first and second current sources are configured to shift the differential voltage so that a negative voltage signal received by the first input pin is not clipped by the first ESD protection circuit. The microcontroller may further include a first ESD protection circuit coupled to the first input pin, and a second ESD protection circuit coupled to the second input pin, wherein the first and second current sources are configured to shift voltages received at the first and second input pins so that the differential voltage is maintained within a normal operating range of the first and second ESD protection circuits. The microcontroller may further include an ADC coupled to an output of the PGA, wherein the ADC may be configured to convert the measured current signal to a digital value for use by the microcontroller. The microcontroller may be suitable for controlling operation of an electric motor, wherein the PGA, via the first and second input pins, is suitable for measuring a current sensed by a shunt resistor coupled to a coil of the electric motor, wherein the first current source may be configured to shift a first voltage signal received by the first input pin by a first predetermined voltage value determined by a first current produced by the first current source and a first resistor coupled between the shunt resistor and the first input pin. The second current source may be configured to shift a second voltage signal received by the second input pin by a second predetermined voltage value determined by a second current produced by the second current source and a second resistor coupled between the shunt resistor and the second input pin, wherein shifting of the first and second voltage signals maintains them within the normal operating range of the PGA so that it can accurately measure a magnitude of the current.

Embodiments of the present disclosure provide an integrated circuit suitable for controlling operation of an electronically commutated electric motor, wherein the integrated circuit includes circuitry configured to produce a current measurement as a function of a differential voltage signal received at first and second input pins of the integrated circuit, wherein the differential voltage signal is supplied by a current sensing element coupled to a coil of the electric motor, a first ESD protection circuit coupled to the first input pin, a second ESD protection circuit coupled to the second input pin, a first current source coupled between a voltage source terminal of the integrated circuit and the first input pin, and a second current source coupled between the voltage source terminal and the second input pin. The first current source may be configured to shift a voltage portion of the differential voltage signal so that the first ESD protection circuit does not truncate the voltage portion received by the first input pin. The first and second current sources may be configured to shift the differential voltage so that magnitudes of the differential voltage are maintained within a normal operating range of the first and second ESD protection circuits. The first current source may be configured to produce a first current, $I_1$, at the first input pin, wherein the second current source may be configured to produce a second current, $I_2$, at the second input pin, and wherein the first current source may be configured to shift a first voltage received at the first pin relative to a second voltage sensed at a first terminal of the current sensing element by an amount equal to $I_1*R_1$, wherein $R_1$ is a first resistive value of a first resistor coupled between the first terminal of the current sensing element and the first input pin, and wherein the second current source may be configured to shift a third voltage received at the second pin relative to a fourth voltage sensed at a second terminal of the current sensing element by an amount equal to $I_2*R_2$, wherein $R_2$ is a second resistive value of a second resistor coupled between the second terminal of the current sensing element and the second input pin, wherein the differential voltage is a difference between the first and third voltages.

A number of embodiments of the disclosure have been described. Nevertheless, it will be understood that various modifications may be made without departing from the spirit and scope of the present disclosure. Accordingly, other embodiments are within the scope of the following claims.

It will be appreciated that any components said to be coupled may be coupled or connected either directly or indirectly. In the case of indirect coupling, additional components may be located between the two components that are said to be coupled.

The singular forms "a," "an," and "the" include plural referents unless the context clearly dictates otherwise. As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

As used herein with respect to an identified property or circumstance, "substantially" refers to a degree of deviation that is sufficiently small so as to not measurably detract from the identified property or circumstance. The exact degree of deviation allowable may in some cases depend on the specific context.

To the extent not described herein, many details regarding specific materials, processing acts, circuits, and circuit elements are conventional, and may be found in textbooks and other sources within the computing, electronics, and software arts.

Various units, circuits, or other components may be described as "configured to" perform a task or tasks. In such contexts, "configured to" is a broad recitation of structure generally meaning "having circuitry that is capable of" performing the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke a 35 U.S.C. § 112, paragraph six interpretation for that unit/circuit/component.

What is claimed is:

1. An apparatus suitable for measuring a current in a coil of an electric motor comprising:
   a shunt resistor with a first terminal adaptable for coupling to a switching element configured to provide power to the coil of the electric motor, and a second terminal adaptable for coupling to a ground potential;
   a microcontroller configured to control operation of the electric motor, wherein the microcontroller comprises:
      a first input pin;
      a second input pin;
      a first electrostatic discharge ("ESD") protection circuit coupled to the first input pin;
      a second ESD protection circuit coupled to the second input pin;
      a first current source coupled between a voltage source terminal and the first input pin; and
      a second current source coupled between the voltage source terminal and the second input pin;
   a first resistor coupled between the first terminal of the shunt resistor and the first input pin; and a second resistor coupled between the second terminal of the shunt resistor and the second input pin.

2. The apparatus as recited in claim 1, wherein the first and second current sources are configured to shift a differential voltage between the first and second input pins by an amount proportional to voltage drops across the first and second resistors caused by currents supplied by the first and second current sources, respectively, wherein the differential voltage is produced by the shunt resistor sensing the current in the coil of the electric motor.

3. The apparatus as recited in claim 2, wherein the microcontroller comprises:
current measurement circuitry configured to produce an analog current measurement as a function of the differential voltage, wherein the current measurement circuitry is coupled to the first and second input pins; and
an analog-to-digital converter ("ADC") coupled to an output of the current measurement circuitry, wherein the ADC is configured to convert the analog current measurement to a digital value for use by the microcontroller in controlling the operation of the electric motor.

4. The apparatus as recited in claim 1, wherein the first current source is configured to shift a voltage signal received by the first pin so that the first ESD protection circuit does not clip the voltage signal when the shunt resistor senses a negative current in the coil, wherein the voltage signal is produced by the shunt resistor sensing the negative current in the coil of the electric motor.

5. The apparatus as recited in claim 1, wherein the first current source is configured to produce a first current, $I_1$, at the first input pin, and wherein the second current source is configured to produce a second current, $I_2$, at the second input pin, and wherein the first resistor has a first resistance, $R_1$, and wherein the second resistor has a second resistance, $R_2$, wherein the first current source is configured to shift a first voltage received at the first pin relative to a second voltage sensed at the first terminal of the shunt resistor by an amount equal to $I_1*R_1$, and wherein the second current source is configured to shift a third voltage received at the second pin relative to a fourth voltage sensed at the second terminal of the shunt resistor by an amount equal to $I_2*R_2$.

6. The apparatus as recited in claim 5, wherein at least one of the first and second current sources is a variable current source.

7. The apparatus as recited in claim 6, wherein the variable current source is adjusted to reduce a difference between $I_1*R_1$ and $I_2*R_2$.

8. The apparatus as recited in claim 6, wherein the variable current source is adjusted to obtain a zero or minimum offset between the first and second input pins when a voltage differential between the second and fourth voltages is zero.

9. The apparatus as recited in claim 1, wherein the electric motor is a brushless DC electric motor.

10. A microcontroller comprising:
a first input pin;
a second input pin;
a programmable gain amplifier ("PGA") configured to measure a current signal represented by a differential voltage received at the first and second input pins;
a first current source coupled between a voltage source terminal and the first input pin; and
a second current source coupled between the voltage source terminal and the second input pin, wherein the first and second current sources are configured to shift the differential voltage so that it is maintained within a normal operating range of the PGA.

11. The microcontroller as recited in claim 10, further comprising:
a first ESD protection circuit coupled to the first input pin; and
a second ESD protection circuit coupled to the second input pin, wherein the first and second current sources are configured to shift the differential voltage so that the first ESD protection circuit does not clip a voltage signal received by the first input pin.

12. The microcontroller as recited in claim 10, further comprising:
a first ESD protection circuit coupled to the first input pin; and
a second ESD protection circuit coupled to the second input pin, wherein the first and second current sources are configured to shift the differential voltage so that a negative voltage signal received by the first input pin is not clipped by the first ESD protection circuit.

13. The microcontroller as recited in claim 10, further comprising:
a first ESD protection circuit coupled to the first input pin; and
a second ESD protection circuit coupled to the second input pin, wherein the first and second current sources are configured to shift voltages received at the first and second input pins so that the differential voltage is maintained within a normal operating range of the first and second ESD protection circuits.

14. The microcontroller as recited in claim 10, further comprising an ADC coupled to an output of the PGA, wherein the ADC is configured to convert the measured current signal to a digital value for use by the microcontroller.

15. The microcontroller as recited in claim 10, wherein the microcontroller is suitable for controlling operation of an electric motor, and wherein the PGA, via the first and second input pins, is suitable for measuring a current sensed by a shunt resistor coupled to a coil of the electric motor, wherein the first current source is configured to shift a first voltage signal received by the first input pin by a first predetermined voltage value determined by a first current produced by the first current source and a first resistor coupled between the shunt resistor and the first input pin.

16. The microcontroller as recited in claim 15, wherein the second current source is configured to shift a second voltage signal received by the second input pin by a second predetermined voltage value determined by a second current produced by the second current source and a second resistor coupled between the shunt resistor and the second input pin, wherein shifting of the first and second voltage signals maintains them within the normal operating range of the PGA so that it can accurately measure a magnitude of the current.

17. An integrated circuit suitable for controlling operation of an electronically commutated electric motor, the integrated circuit comprising:
circuitry configured to produce a current measurement as a function of a differential voltage signal received at first and second input pins of the integrated circuit, wherein the differential voltage signal is supplied by a current sensing element coupled to a coil of the electric motor;
a first ESD protection circuit coupled to the first input pin;
a second ESD protection circuit coupled to the second input pin;

a first current source coupled between a voltage source terminal of the integrated circuit and the first input pin; and a second current source coupled between the voltage source terminal and the second input pin.

18. The integrated circuit as recited in claim 17, wherein the first current source is configured to shift a voltage portion of the differential voltage signal so that the first ESD protection circuit does not truncate the voltage portion received by the first input pin.

19. The integrated circuit as recited in claim 17, wherein the first and second current sources are configured to shift the differential voltage so that magnitudes of the differential voltage are maintained within a normal operating range of the first and second ESD protection circuits.

20. The integrated circuit as recited in claim 17, wherein the first current source is configured to produce a first current, $I_1$, at the first input pin, and wherein the second current source is configured to produce a second current, $I_2$, at the second input pin, wherein the first current source is configured to shift a first voltage received at the first pin relative to a second voltage sensed at a first terminal of the current sensing element by an amount equal to $I_1*R_1$, wherein $R_1$ is a first resistive value of a first resistor coupled between the first terminal of the current sensing element and the first input pin, and wherein the second current source is configured to shift a third voltage received at the second pin relative to a fourth voltage sensed at a second terminal of the current sensing element by an amount equal to $I_2*R_2$, wherein $R_2$ is a second resistive value of a second resistor coupled between the second terminal of the current sensing element and the second input pin, wherein the differential voltage is a difference between the first and third voltages.

* * * * *